(12) United States Patent
Wang et al.

(10) Patent No.: US 10,811,569 B2
(45) Date of Patent: Oct. 20, 2020

(54) INORGANIC LIGHT-EMITTING DIODE DISPLAY PANEL, MANUFACTURING METHOD THEREOF AND DISPLAY DEVICE

(71) Applicant: BOE TECHNOLOGY GROUP CO., LTD., Beijing (CN)

(72) Inventors: Can Wang, Beijing (CN); Can Zhang, Beijing (CN); Han Yue, Beijing (CN); Ming Yang, Beijing (CN); Ning Cong, Beijing (CN); Minghua Xuan, Beijing (CN); Xiaochuan Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/440,115

(22) Filed: Jun. 13, 2019

(65) Prior Publication Data
US 2020/0066942 A1 Feb. 27, 2020

(30) Foreign Application Priority Data
Aug. 23, 2018 (CN) .......................... 2018 1 0968240

(51) Int. Cl.
*H01L 33/46* (2010.01)
*H01L 27/15* (2006.01)
(Continued)

(52) U.S. Cl.
CPC .......... *H01L 33/465* (2013.01); *H01L 27/156* (2013.01); *H01L 33/005* (2013.01);
(Continued)

(58) Field of Classification Search
CPC ... H01L 33/465; H01L 27/156; H01L 33/005; H01L 33/405; H01L 2933/0016;
(Continued)

(56) References Cited

U.S. PATENT DOCUMENTS

2012/0050694 A1 3/2012 Huang et al.
2012/0099048 A1* 4/2012 Yamazaki ............... H01L 33/50
349/62

(Continued)

FOREIGN PATENT DOCUMENTS

CM 102386200 A 3/2012
CN 101094543 A 12/2007

(Continued)

OTHER PUBLICATIONS

Björk et al. ("Modification of spontaneous emission rate in planar dielectric microcavity structures," Physical Review A. vol. 44, No. 1, pp. 669-681, Jul. 1, 1991) (Year: 1991).*

(Continued)

*Primary Examiner* — Yasser A Abdelaziez
(74) *Attorney, Agent, or Firm* — Dilworth & Barrese, LLP.; Michael J. Musella, Esq.

(57) ABSTRACT

An inorganic light-emitting diode display panel and manufacturing method thereof and a display device are provided. The inorganic light-emitting diode display panel includes: a base substrate; a microcavity structure and an inorganic light-emitting diode which are disposed on the base substrate. The microcavity structure includes a reflective layer, a semi-reflective layer and a dielectric layer located between the reflective layer and the semi-reflective layer; the inorganic light-emitting diode includes a light-emitting layer, and the light-emitting layer is located in the dielectric layer; and a distance between the reflective layer and the semi-reflective layer is in a same order of magnitude as a wavelength of light emitted by the inorganic light-emitting diode.

20 Claims, 6 Drawing Sheets

(51) Int. Cl.
*H01L 33/00* (2010.01)
*H01L 33/40* (2010.01)

(52) U.S. Cl.
CPC .... *H01L 33/405* (2013.01); *H01L 2933/0016* (2013.01); *H01L 2933/0025* (2013.01)

(58) Field of Classification Search
CPC ............. H01L 2933/0025; H01L 33/60; H01L 25/167; H01L 25/0753
See application file for complete search history.

(56) References Cited

U.S. PATENT DOCUMENTS

2015/0115293 A1* 4/2015 Wu .................... H01L 24/24 257/88
2016/0233399 A1* 8/2016 Maki .................. H01L 33/62

FOREIGN PATENT DOCUMENTS

| CN | 204271141 U | 4/2015 |
| CN | 107146835 A | 6/2017 |
| CN | 107195654 A | 9/2017 |
| JP | 2000174327 A | 6/2000 |

OTHER PUBLICATIONS

Kashiwabara et al. ("Advanced AM-OLED Display Based on White Emitter with Microcavity Structure," SID Symposium Digest of Technical Paper, 35:1017-1019, May 2004) (Year: 2004).*
First Chinese Office Action from priority Chinese Application No. 201810968240.9 dated May 15, 2020.
Weibiao, "Microdisplay technology based on group III nitride wide band gap semiconductor", Journal, pp. 15-16, Dec. 2001.
Second Chinese Office Action issued by the Chinese Patent Office in corresponding Chinese Patent Application No. 201810968240.9 dated Aug. 13, 2020.

* cited by examiner

INORGANIC LIGHT-EMITTING DIODE DISPLAY PANEL, MANUFACTURING METHOD THEREOF AND DISPLAY DEVICE

The present application claims the priority of the Chinese Patent Application No. 201810968240.9 filed on Aug. 23, 2018, which is incorporated herein by reference as part of the disclosure of the present application.

TECHNICAL FIELD

Embodiments of the present disclosure relate to an inorganic light-emitting diode display panel, a method of manufacturing the inorganic light-emitting diode display panel and a display device.

BACKGROUND

With the development of flat panel display technology, people are increasingly demanding to the performance of display panels. High resolution, high flexibility, high transparency, high brightness, high contrast, small weight and thickness, low power consumption, high color gamut and so on become the development directions of the display panels.

At present, flat panel display devices comprise liquid crystal display (LCD) devices and organic light-emitting diode (OLED) display devices. In general, the LCD devices are difficult to be manufactured as flexible and high color gamut display devices, and the power consumption of each of the LCD devices is high. The OLED display devices are difficult to be manufactured as the display devices with high resolution and high transmittance, and the OLED display devices have limited illumination life. Inorganic light-emitting diode (LED) display devices, especially Micro LED display devices, are widely used in a display field due to their high transmittance, small weight, low power consumption and high color gamut.

SUMMARY

At least one embodiment of the present disclosure provides an inorganic light-emitting diode display panel, and the inorganic light-emitting diode display panel comprises: a base substrate; and a microcavity structure and an inorganic light-emitting diode which are disposed on the base substrate; and the microcavity structure comprises a reflective layer, a semi-reflective layer and a dielectric layer located between the reflective layer and the semi-reflective layer; the inorganic light-emitting diode comprises a light-emitting layer, and the light-emitting layer is located in the dielectric layer; a distance between the reflective layer and the semi-reflective layer is in a same order of magnitude as a wavelength of light emitted by the inorganic light-emitting diode.

For example, in the inorganic light-emitting diode display panel provided by at least one embodiment of the present disclosure, a relationship between the distance between the reflective layer and the semi-reflective layer and the wavelength of the light emitted by the inorganic light-emitting diode is:

$$d = j\left(\frac{\lambda}{2n}\right);$$

and d is the distance between the reflective layer and the semi-reflective layer; j is a non-zero positive integer; n is a refractive index of the dielectric layer; and $\lambda$ is the wavelength of the light emitted by the inorganic light-emitting diode.

For example, in the inorganic light-emitting diode display panel provided by at least one embodiment of the present disclosure, the inorganic light-emitting diode is a top-emitting inorganic light-emitting diode, and the reflective layer, the dielectric layer and the semi-reflective layer are sequentially disposed away from the base substrate; and the inorganic light-emitting diode further comprises a first electrode disposed on a side of the light-emitting layer close to the base substrate and a second electrode disposed on a side of the light-emitting layer away from the base substrate.

For example, in the inorganic light-emitting diode display panel provided by at least one embodiment of the present disclosure, the reflective layer further serves as the first electrode, or the first electrode is disposed on a side of the reflective layer away from the base substrate and in direct contact with the reflective layer, or the first electrode is disposed on the side of the reflective layer away from the base substrate and spaced apart from the reflective layer.

For example, in the inorganic light-emitting diode display panel provided by at least one embodiment of the present disclosure, the semi-reflective layer further serves as the second electrode, or the second electrode is disposed on a side of the semi-reflective layer close to the base substrate and in direct contact with the semi-reflective layer, or the second electrode is disposed on the side of the semi-reflective layer close to the base substrate and spaced apart from the semi-reflective layer.

For example, the inorganic light-emitting diode display panel provided by at least one embodiment of the present disclosure further comprises a driving circuit disposed on the base substrate, and the reflective layer is electrically connected with the driving circuit in a case that the reflective layer further serves as the first electrode or in a case that the first electrode is disposed on the side of the reflective layer away from the base substrate and in direct contact with the reflective layer.

For example, in the inorganic light-emitting diode display panel provided by at least one embodiment of the present disclosure, the inorganic light-emitting diode is a bottom-emitting inorganic light-emitting diode, and the semi-reflective layer, the dielectric layer and the reflective layer are sequentially disposed away from the base substrate; and the inorganic light-emitting diode further comprises a third electrode disposed on a side of the light-emitting layer close to the base substrate and a fourth electrode disposed on a side of the light-emitting layer away from the base substrate.

For example, in the inorganic light-emitting diode display panel provided by at least one embodiment of the present disclosure, the semi-reflective layer further serves as the third electrode, or the third electrode is disposed on a side of the semi-reflective layer away from the base substrate and in direct contact with the semi-reflective layer, or the third electrode is disposed on the side of the semi-reflective layer away from the base substrate and spaced apart from the semi-reflective layer.

For example, in the inorganic light-emitting diode display panel provided by at least one embodiment of the present disclosure, the reflective layer further serves as the fourth electrode, or the fourth electrode is disposed on a side of the reflective layer close to the base substrate and in direct contact with the reflective layer, or the fourth electrode is disposed on the side of the reflective layer close to the base substrate and spaced apart from the reflective layer.

For example, the inorganic light-emitting diode display panel provided by at least one embodiment of the present disclosure further comprises a driving circuit disposed on the base substrate, and the semi-reflective layer is electrically connected with the driving circuit in a case that the semi-reflective layer further serves as the third electrode or in a case that the third electrode is disposed on the side of the semi-reflective layer away from the base substrate and in direct contact with the semi-reflective layer.

For example, in the inorganic light-emitting diode display panel provided by at least one embodiment of the present disclosure, an orthographic projection of the reflective layer on the base substrate, an orthographic projection of the dielectric layer on the base substrate, and an orthographic projection of the semi-reflective layer on the base substrate overlap each other.

For example, in the inorganic light-emitting diode display panel provided by at least one embodiment of the present disclosure, an area of an orthographic projection of the dielectric layer on the base substrate is larger than an area of an orthographic projection of the light-emitting layer on the base substrate.

For example, the inorganic light-emitting diode display panel provided by at least one embodiment of the present disclosure further comprises a plurality of microcavity structures, and areas of orthographic projections of the dielectric layers included in the plurality of the microcavity structures on the base substrate are equal, and shapes of the orthographic projections of the dielectric layers included in the plurality of the microcavity structures on the base substrate are the same, and distances between the reflective layers and the semi-reflective layers included in the plurality of the microcavity structures are different from each other.

For example, in the inorganic light-emitting diode display panel provided by at least one embodiment of the present disclosure, materials of the dielectric layers included in the plurality of the microcavity structures are the same.

For example, in the inorganic light-emitting diode display panel provided by at least one embodiment of the present disclosure, a material of the dielectric layer includes an organic material or an inorganic material, and the organic material includes at least one of an acrylic resin and a parylene; and the inorganic material includes at least one of silicon oxide, silicon nitride, and silicon oxynitride.

For example, in the inorganic light-emitting diode display panel provided by at least one embodiment of the present disclosure, a material of the reflective layer includes at least one of silver, aluminum, and an aluminum-neodymium alloy; a material of the semi-reflective layer includes at least one of a magnesium-silver alloy, titanium, and molybdenum.

For example, in the inorganic light-emitting diode display panel provided by at least one embodiment of the present disclosure, the inorganic light-emitting diode emits monochrome light, and the monochrome light is red light, green light or blue light.

At least one embodiment of the present disclosure further provides a display device, and the display device comprises any one of the inorganic light-emitting diode display panels in the above embodiments.

At least one embodiment of the present disclosure further provides a method of manufacturing an inorganic light-emitting diode display panel, and the manufacturing method comprises: providing a base substrate; forming a microcavity structure and an inorganic light-emitting diode on the base substrate; and the forming the microcavity structure comprises forming a reflective layer, a semi-reflective layer, and a dielectric layer located between the reflective layer and the semi-reflective layer; the forming the inorganic light-emitting diode comprises forming a light-emitting layer, and the light-emitting layer is located in the dielectric layer; a distance between the reflective layer and the semi-reflective layer is in a same order of magnitude as a wavelength of light emitted by the inorganic light-emitting diode.

For example, in the manufacturing method provided by at least one embodiment of the present disclosure, a relationship between the distance between the reflective layer and the semi-reflective layer and the wavelength of the light emitted by the inorganic light-emitting diode is:

$$d = j\left(\frac{\lambda}{2n}\right);$$

and d is the distance between the reflective layer and the semi-reflective layer; j is a non-zero positive integer; n is a refractive index of the dielectric layer; and λ is the wavelength of the light emitted by the inorganic light-emitting diode.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of embodiments of the disclosure clear, the technical solutions of the embodiments will be described in a clearly and fully understandable way in connection with the related drawings. It is apparent that the described embodiments are just a part but not all of the embodiments of the disclosure. Based on the described embodiments herein, those skilled in the art can obtain, without any inventive work, other embodiment(s) which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and claims of the present application, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "interconnect", etc., are not intended to define a physical connection or mechanical connection, but may include an electrical connection which is direct or indirect. The terms "on," "under," "right," "left" and the like are only used to indicate relative position relationship, and when the position of an object is described as being changed, the relative position relationship may be changed accordingly.

Figure 1:
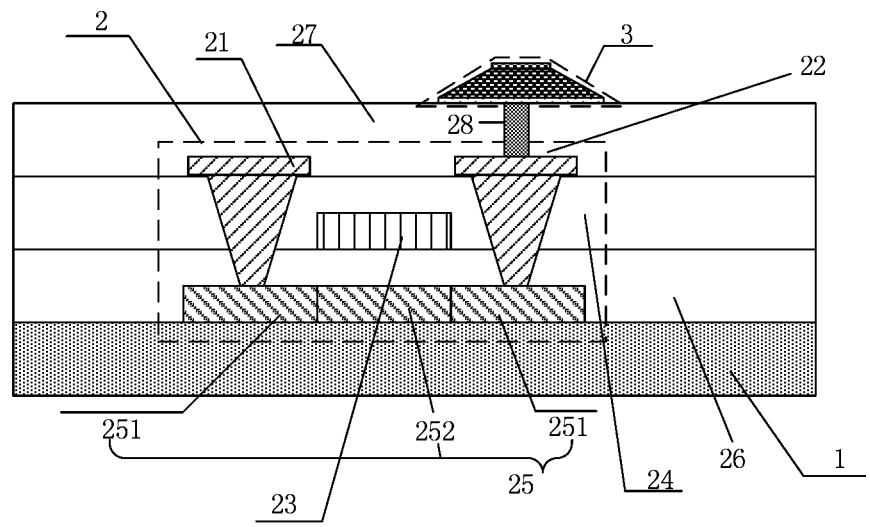
FIG. 1 is a schematic sectional view of an inorganic light-emitting diode display panel.

FIG. 1 is a schematic sectional view of an inorganic light-emitting diode display panel. As illustrated in FIG. 1, a driving circuit 2 is arranged on a base substrate 1 to form a driving backplate, and the driving circuit 2 comprises a semiconductor active layer 25, a gate insulating layer 26, a gate electrode 23, a first insulating layer 24, a source electrode 21, a drain electrode 22 and a second insulating layer 27 which are successively disposed on the base substrate 1. The semiconductor active layer 25 comprises: an ohmic contact region 251 and a channel region 252, the ohmic contact region 251 has a good conductivity, and the ohmic contact region 251 is electrically connected with the source electrode 21 and the drain electrode 22 respectively. An inorganic light-emitting diode 3 is disposed on a preset position of the second insulating layer 27. For example, the inorganic light-emitting diode 3 is a Micro LED, and a lower electrode of the inorganic light-emitting diode 3 is electrically connected with the drain electrode 22 of the driving circuit 2. For example, the lower electrode of the inorganic light-emitting diode 3 is electrically connected with the drain electrode 22 of the driving circuit 2 by a via hole structure 28 formed in the second insulating layer 27. A current provided by the driving circuit 2 drives the inorganic light-emitting diode 3 to emit light, and then the inorganic light-emitting diode 3 displays a corresponding image or picture.

For example, a size of the Micro LED is only about 1 μm to 10 μm. A Micro LED display panel having a high resolution is formed by arranging the Micro LEDs, and the Micro LED has advantages of high luminous efficiency, low energy consumption and high resolution, and the Micro LED further has the advantages of high contrast, high refresh rate and wide viewing angle. In addition, the Micro LED provides a wider color gamut and a higher brightness, and the Micro LED has advantages of low energy consumption, long life, durability and environmental stability.

Figure 2:
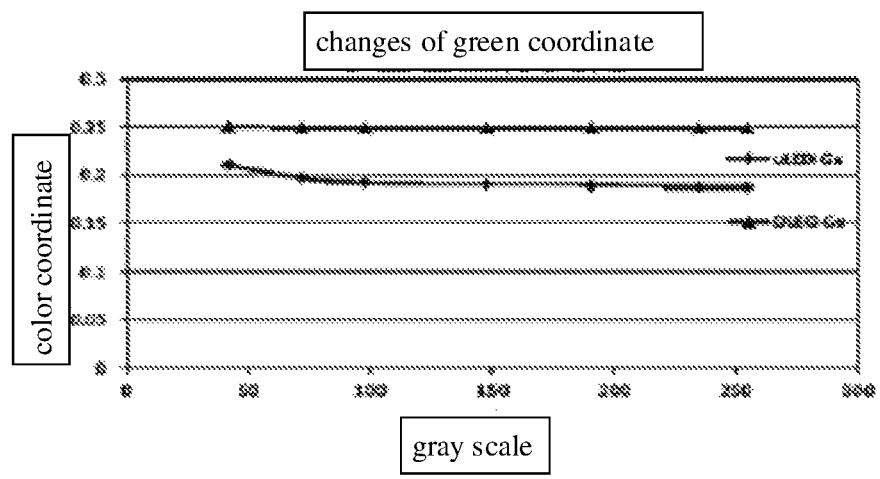
FIG. 2 is a coordinate comparison chart of a green coordinate of an OLED changing on a horizontal axis and a green coordinate of a Micro LED changing on the horizontal axis.
Figure 3:
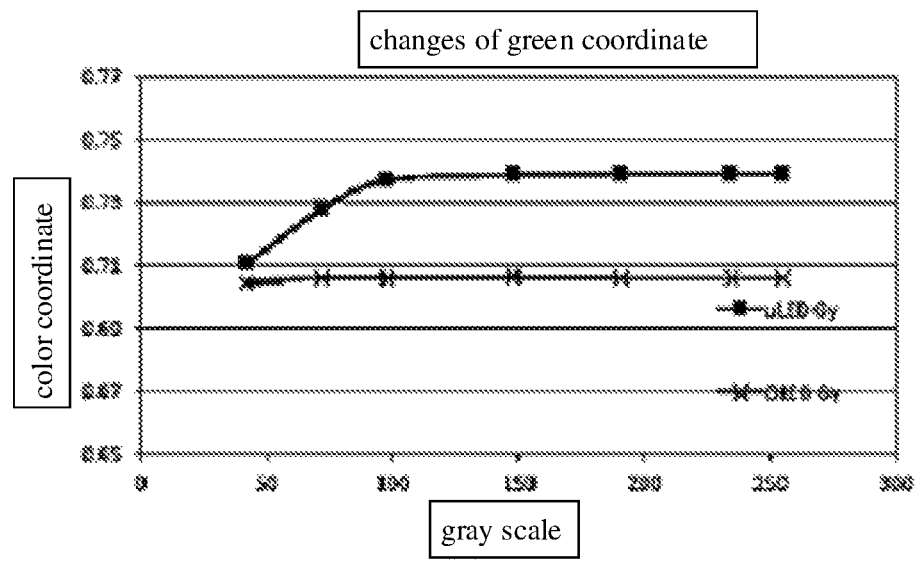
FIG. 3 is a coordinate comparison chart of the green coordinate of the OLED illustrated in FIG. 2 changing on a vertical axis and the green coordinate of the Micro LED illustrated in FIG. 2 changing on the vertical axis.

The inventor of the present disclosure finds that in a case that the inorganic light-emitting diode 3 displays at a low gray scale (such as a gray scale less than or equal to 50) or at a high gray scale (such as a gray scale greater than or equal to 250), the color coordinates of the inorganic light-emitting diode 3 has different degrees of drift, which eventually leads to white distortion, and thereby the display effect becomes worse. The following is illustrated by taking the Micro LED as an example of the inorganic light-emitting diode. For example, FIG. 2 is a coordinate comparison chart of a green coordinate of an OLED changing on a horizontal axis and a green coordinate of a Micro LED changing on the horizontal axis, and FIG. 3 is a coordinate comparison chart of the green coordinate of the OLED illustrated in FIG. 2 changing on a vertical axis and the green coordinate of the Micro LED illustrated in FIG. 2 changing on the vertical axis. Taking green as an example, uLED Gx in FIG. 2 represents an X-color coordinate of the Micro LED, and OLED (Organic Light-emitting Diode) Gx in FIG. 2 represents an X-color coordinate of the OLED; uLED Gy in FIG. 3 represents a y-color coordinate of the Micro LED, and OLED Gy in FIG. 3 represents a y-color coordinate of the OLED.

As illustrated in FIG. 2 and FIG. 3, compared with the OLED, in a case that the gray is less than 100, the drift of the horizontal coordinate (x-color coordinate) and the vertical coordinate (y-color coordinate) of the green color coordinate of the Micro LED are larger than the drift of the horizontal coordinate and the vertical coordinate of the green color coordinates of the OLED. The drift of the color coordinates cannot guarantee a white balance at the low gray scale, which eventually leads to white distortion, and then affects the display effect of the Micro LED display panel.

The inventors of the present disclosure further finds that, in a case that the light-emitting region of the Micro LED is located in a resonant cavity composed of a total reflective layer, a dielectric layer and a semi-reflective layer, and a cavity length of the resonant cavity is in a same order of magnitude as a wavelength of the emitted light (visible light), that is to say in a case that both the cavity length of the resonant cavity and the wavelength of the emitted light (visible light) are in the same order such as $10^2$ nm, light with a specific wavelength is selected and strengthened by the resonant cavity, and the spectrum of the light with the specific wavelength is narrowed at the same time, which is microcavity effect. Therefore, the design of the resonant cavity is very important for the inorganic light-emitting diodes. In a case that the wavelength λ of the emitted light satisfies the following formula (1), optical resonance in the resonant cavity is allowed:

$$|\phi_1| + |\phi_2| + \frac{2\pi}{\lambda} \sum 2n_i d_i = m 2\pi \tag{1}$$

in which $n_i$ represents a refractive index of the dielectric layer, and $d_i$ represents a thickness of the dielectric layer; m is a positive integer, which is a modulus of the resonant cavity; $\phi_1$ and $\phi_2$ represent phase shifts of light at interfaces of the reflective layer and the semi-reflective layer respectively; and λ is the wavelength of the emitted light.

Further, φ is calculated by formula (2):

$$\phi = \arctg\left(\frac{2K_m^n}{n^2 - N_m^2 - K_m^2}\right) \quad (2)$$

in which $N_m$ represents a refractive index of the reflective layer or the semi-reflective layer and $K_m$ represents an extinction coefficient of the reflective layer or the semi-reflective layer; n is a refractive index of the dielectric layer.

In addition, the strength of the microcavity effect is calculated by a Full Width at Half Maximum (FWHM). The strength of the microcavity effect satisfies the formula (3):

$$FWHM = \frac{\lambda^2}{2nd} \times \frac{1 - \sqrt{R_b R_t}}{\pi \sqrt[4]{R_b R_t}} \quad (3)$$

in which d is the thickness of the dielectric layer; λ is the wavelength of the emitted light; n is the refractive index of the dielectric layer in the resonant cavity; $R_b$ is a reflectivity of the reflective layer; and $R_f$ is a reflectivity of the semi-reflective layer. The smaller the FWHM is, the stronger the microcavity effect is, the easier to emit light with a single wavelength, the higher the purity of the emitted light is and the greater the intensity of the emitted light is.

For example, a resonant mode of the resonant cavity satisfies an F-P equation, which is formulated as equation (4):

$$L = \Sigma_i n_i d_i + \left|\frac{\varphi \lambda}{4\pi}\right| = m\frac{\lambda}{2} \quad (4)$$

in which L is a total length of the resonant cavity; φ represents the phase shift of light at the interface of the reflective layer or at the interface of the semi-reflective layer; $n_i$ represents a refractive index of the dielectric layer in the resonant cavity, and $d_i$ represents a thickness of the dielectric layer in the resonant cavity; m is a positive integer, which is the modulus of the resonant cavity; and λ is the wavelength of the emitted light.

The formula for calculating the wavelength of the emitted light is obtained by the formula (4):

$$\lambda = 2m\Sigma_i n_i d_i + m\left|\frac{\varphi \lambda}{2\pi}\right| \quad (5)$$

According to the above formulas, it can be concluded that the length of the resonant cavity affects the light peak, and the reflectivity of the dielectric layer affects the width of the half peak.

At least one embodiment of the present disclosure provides an inorganic light-emitting diode display panel, and the inorganic light-emitting diode display panel comprises: a base substrate; and a microcavity structure and an inorganic light-emitting diode which are disposed on the base substrate; and the microcavity structure comprises a reflective layer, a semi-reflective layer and a dielectric layer located between the reflective layer and the semi-reflective layer; the inorganic light-emitting diode comprises a light-emitting layer, and the light-emitting layer is located in the dielectric layer; a distance between the reflective layer and the semi-reflective layer is in a same order of magnitude as a wavelength of light emitted by the inorganic light-emitting diode.

It should be noted that, the "in a same order of magnitude" in "the distance between the reflective layer and the semi-reflective layer is in the same order of magnitude as a wavelength of light emitted by the inorganic light-emitting diode" means that in a same unit, for example, in the unit of meters (m), microns (μm) or nanometers (nm), the order of magnitude is the same. For example, the distance between the reflective layer and the semi-reflective layer is $a*10^b$ nm, the wavelength of the light emitted by the inorganic light-emitting diode is $c*10^d$ nm; "a" and "c" are positive numbers less than 10, "a" and "c" are same with or different from each other; and "b" and "d" are the same natural numbers.

For example, the distance between the reflective layer and the semi-reflective layer is the thickness of the dielectric layer.

For example, in a case that the driving circuit provides electrical signal for the inorganic light-emitting diode, the light emitted from the light-emitting layer is strengthened by the microcavity structure, and the spectrum corresponding to the emitted light is narrowed. For example, in a case that the light emitted by the inorganic light-emitting diode is green light, the green light is strengthened and the corresponding spectrum of the green light is narrowed, which improves the purity of the green light, thus white distortion is avoided, thereby the overall display effect of the inorganic light-emitting diode display panel is improved. Similarly, red light and blue light has the same principle.

Figure 4:
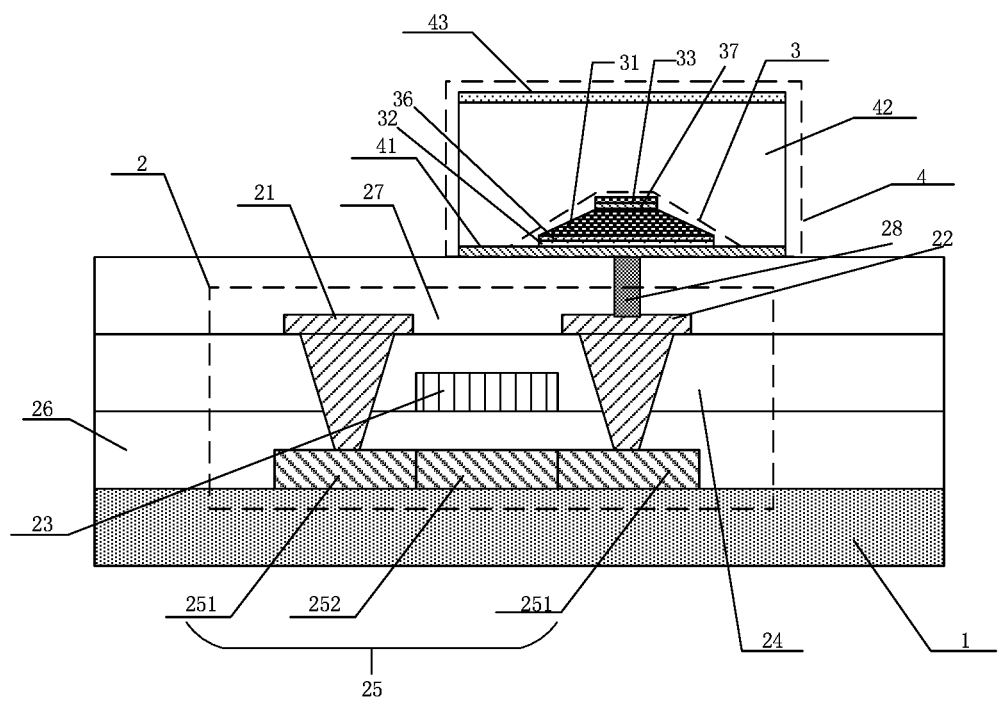
FIG. 4 is a schematic sectional view of a top-emitting inorganic light-emitting diode display panel provided by at least one embodiment of the present disclosure.

For example, FIG. 4 is a schematic sectional view of a top-emitting inorganic light-emitting diode display panel provided by at least one embodiment of the present disclosure. As illustrated in FIG. 4, the top emitting inorganic light-emitting diode display panel comprises: a base substrate 1, a microcavity structure 4 and an inorganic light-emitting diode 3 which are disposed on the base substrate 1; the microcavity structure 4 comprises a reflective layer 41, a semi-reflective layer 43 and a dielectric layer 42 located between the reflective layer 41 and the semi-reflective layer; the inorganic light-emitting diode 3 comprises a light-emitting layer 31, and the light-emitting layer 31 is located in dielectric layer 42. A distance between the reflective layer 41 and the semi-reflective layer 43 is in a same order of magnitude as a wavelength of light emitted by the inorganic light-emitting diode 3. The distance between the reflective layer 41 and the semi-reflective layer 43 is the thickness of the dielectric layer 42, that is, the thickness of the dielectric layer 42 is in the same order of magnitude as the wavelength of light emitted by the inorganic light-emitting diode 3. For example, the following is illustrated by taking a Micro LED as an example of the inorganic light-emitting diode 3.

For example, the dielectric layer 42 is disposed on the Micro LED 3 and covers the Micro LED 3. The semi-reflective layer 43 is arranged on a side of the dielectric layer 42 away from the base substrate. That is the reflective layer 41, the dielectric layer 42 and the semi-reflective layer 43 are sequentially disposed away from the base substrate 1.

For example, the distance between the reflective layer 41 and the semi-reflective layer 43 is from about 100 nm to 999 nm.

For example, an orthographic projection of the reflective layer 41 on the base substrate 1, an orthographic projection of the dielectric layer 42 on the base substrate 1, and an orthographic projection of the semi-reflective layer 43 on the base substrate 1 overlap each other.

For example, the orthographic projection of the reflective layer 41 on the base substrate 1, the orthographic projection of the dielectric layer 42 on the base substrate 1, and the orthographic projection of the semi-reflective layer 43 on the base substrate 1 overlap each other completely. An area of the orthographic projection of the reflective layer 41 on the base substrate 1, an area of the orthographic projection of the dielectric layer 42 on the base substrate 1 and an area of the orthographic projection of the semi-reflective layer 43 on the base substrate 1 are equal.

For example, the area of the orthographic projection of the dielectric layer 42 on the base substrate 1 is larger than the area of the orthographic projection of the Micro LED 3 on the base substrate 1.

For example, a material of the dielectric layer 42 includes an organic material or an inorganic material.

For example, the organic material includes at least one of an acrylic resin and a parylene.

For example, the inorganic material includes at least one of silicon oxide, silicon nitride, and silicon oxynitride.

For example, a material of the reflective layer 41 includes at least one of silver, aluminum, and an aluminum-neodymium alloy.

For example, a material of the semi-reflective layer 43 includes at least one of a magnesium-silver alloy, titanium, and molybdenum.

For example, the Micro LED 3 illustrated in FIG. 4 comprises a first electrode 32, a first semiconductor 36, the light-emitting layer 31, a second semiconductor 37 and a second electrode 33 which are stacked in sequence.

For example, the first electrode 32 is located on a side of the light-emitting layer 31 close to the base substrate 1, and the second electrode 33 is located on a side of the light-emitting layer 31 away from the base substrate 1.

For example, the first electrode 32 is an electrode formed by a metal material that reflects light, and the second electrode 33 is an electrode formed by a material that transmits light.

It should be noted that, one of the first semiconductor layer 36 and the second semiconductor layer 37 generates electrons and injects the electrons into the light-emitting layer 31, the other of the first semiconductor layer 36 and the second semiconductor layer 37 generates holes and injects the holes into the light-emitting layer 31. The holes and the electrons recombine in the light-emitting layer 31 to make the light-emitting layer 31 emit light.

For example, the first semiconductor layer 36 is an N-type gallium nitride layer, and the second semiconductor layer 37 is a P-type gallium nitride layer; or the first semiconductor layer 36 is the P-type gallium nitride layer, and the second semiconductor layer 37 is the N-type gallium nitride layer.

For example, as illustrated in FIG. 4, the first electrode 32 is located on a side of the reflective layer 41 away from the base substrate 1 and in direct contact with the reflective layer 41.

For example, although not shown, the reflective layer 41 further serves as the first electrode 32 without additional fabrication of the first electrode 32, which saves the process of forming the first electrode separately and thus saves the production cost.

For example, the first electrode 32 is disposed on a side of the reflective layer 41 away from the base substrate 1 and spaced apart from the reflective layer 41, and a portion of the dielectric layer 42 for example is arranged between the first electrode 32 and the reflective layer 41.

For example, as illustrated in FIG. 4, the whole Micro LED 3 is located in the microcavity structure 4. In FIG. 4, the second electrode 33 is disposed on a side of the semi-reflective layer 43 close to the base substrate 1 and spaced apart from the semi-reflective layer 43, and a portion of the dielectric layer 42 is arranged between the second electrode 33 and the semi-reflective layer 43.

For example, although not shown, the second electrode 33 is disposed on the side of the semi-reflective layer 43 close to the base substrate 1 and in direct contact with the semi-reflective layer 43, or the semi-reflective layer 43 further serves as the second electrode 33.

As illustrated in FIG. 4, a distance between the reflective layer 41 and the semi-reflective layer 43, that is a thickness of the dielectric layer 42, is in a same order of magnitude as a wavelength of light emitted by the Micro LED 3. For example, the light emitted by the Micro LED 3 is visible and the wavelength of the emitted light is in the order of $10^2$ nm. The thickness of the dielectric layer 42 is arranged according to the wavelength of the emitted light and a refractive index of the dielectric layer 42.

For example, the inorganic light-emitting diode display panel further comprises a driving circuit 2 arranged on the base substrate 1.

As illustrated in FIG. 4, the driving circuit 2 comprises a semiconductor active layer 25, a gate insulating layer 26, a gate electrode 23, a first insulating layer 24, a source electrode 21, a drain electrode 22 and a second insulating layer 27 which are successively disposed on the base substrate 1. The second insulating layer 27 is provided with a via hole structure 28. The semiconductor active layer 25 comprises: an ohmic contact region 251 and a channel region 252, the ohmic contact region 251 has a good conductivity, and the ohmic contact region 251 is electrically connected with source electrode 21 and the drain electrode 22 respectively.

For example, in a case that the reflective layer 41 further serves as the first electrode 32 or in a case that the first electrode 32 is disposed on the side of the reflective layer 41 away from the base substrate 1 and in direct contact with the reflective layer 41, the reflective layer 41 is electrically connected to the drain electrode 22 of the driving circuit 2 by the via hole structure 28 arranged in the second insulating layer 27.

For example, in a case that the first electrode 32 is disposed on the side of the reflective layer 41 away from the base substrate 1 and spaced apart from the reflective layer 41, the Micro LED 3 is electrically connected with the driving circuit 2 for example by an external circuit.

For example, in the top-emitting inorganic light-emitting diode display panel provided by the embodiment of the present disclosure, the microcavity structure 4 is arranged in the light-emitting region of the Micro LED 3, and the microcavity structure 4 comprises the reflective layer 41, the semi-reflective layer 43 and the dielectric layer 42 located between the reflective layer 41 and the semi-reflective layer 43. In the case that the thickness of dielectric layer 42 is in the same order of magnitude as the wavelength of the light emitted by the Micro LED 3, the emitted light is selected and strengthened by the microcavity structure 4, and the corresponding spectrum is narrowed. In the case that the emitted light is green light, the green light is strengthened and the corresponding spectrum is narrowed, which improves the purity of the green light, thereby the white distortion is avoided, and the display effect of the whole top-emitting Micro LED display panel is improved. In addition, because the thickness of the dielectric layer 42 is designed according to the wavelength of the emitted light and the refractive index of the dielectric layer 42, the distance between the reflective layer 41 and the semi-reflective layer 43 is adjusted to be in the same order of magnitude as the wavelength of the light emitted by the Micro LED 3. Thus, the distance between the reflective layer 41 and the semi-reflective layer 43 is adjusted to form different inorganic light-emitting diodes, so that the microcavity structures 4 of different inorganic light-emitting diodes improves the purity of different colors of light, thereby the display effect is improved.

Figure 5:
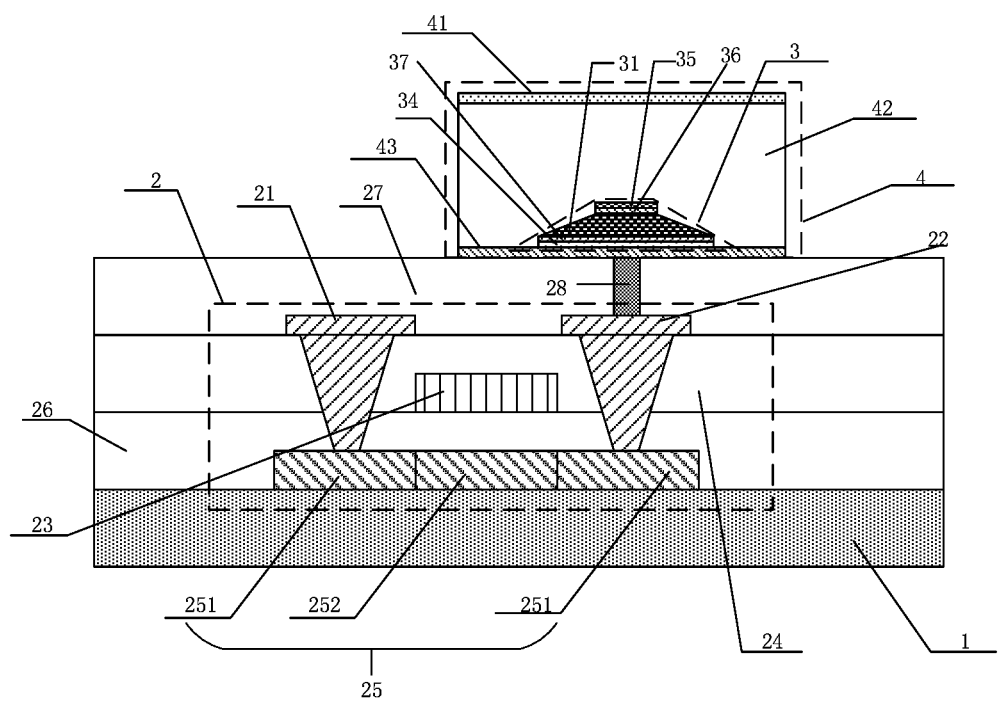
FIG. 5 is a schematic sectional view of a bottom-emitting inorganic light-emitting diode display panel provided by at least one embodiment of the present disclosure.

For example, FIG. 5 is a schematic sectional view of a bottom-emitting inorganic light-emitting diode display panel provided by at least one embodiment of the present disclosure. As illustrated in FIG. 5, the bottom-emitting inorganic light-emitting diode display panel comprises: a base substrate 1, a microcavity structure 4 and an inorganic light-emitting diode 3 which are disposed on the base substrate 1. The microcavity structure 4 comprises a semi-reflective layer 43 and a reflective layer 41, and a dielectric layer 42 disposed between the reflective layer 41 and the semi-reflective layer 43. The inorganic light-emitting diode 3 comprises a light-emitting layer 31, and the light-emitting layer 31 is located in the dielectric layer 42. A distance between the reflective layer 41 and the semi-reflective layer 43 is in a same order of magnitude as a wavelength of light emitted by the inorganic light-emitting diode 3. The distance between the reflective layer 41 and the semi-reflective layer 43 is a thickness of the dielectric layer 42, and the thickness of the dielectric layer 42 is in the same order of magnitude as the wavelength of light emitted by the inorganic light-emitting diode 3. For example, the following is still illustrated by taking the Micro LED 3 as the example of the inorganic light-emitting diode 3.

For example, the dielectric layer 42 is arranged on the Micro LED 3 and covers the Micro LED 3. The reflective layer 41 is arranged on a side of the dielectric layer 42 away from the base substrate 1, that is, the semi-reflective layer 43, the dielectric layer 42 and the reflective layer 41 are sequentially disposed away from the base substrate 1.

For example, the distance between the reflective layer 41 and the semi-reflective layer 43 is from about 100 to 999 nm.

For example, an orthographic projection of the reflective layer 41 on the base substrate 1, an orthographic projection of the dielectric layer 42 on the base substrate 1, and an orthographic projection of the semi-reflective layer 43 on the base substrate 1 overlap each other.

For example, the orthographic projection of the reflective layer 41 on the base substrate 1, the orthographic projection of the dielectric layer 42 on the base substrate 1, and the orthographic projection of the semi-reflective layer 43 on the base substrate 1 overlap each other completely. An area of the orthographic projection of the reflective layer 41 on the base substrate 1, an area of the orthographic projection of the dielectric layer 42 on the base substrate 1 and an area of the orthographic projection of the semi-reflective layer 43 on the base substrate 1 are equal.

For example, the area of the orthographic projection of the dielectric layer 42 on the base substrate 1 is larger than the area of the orthographic projection of the Micro LED 3 on the base substrate 1.

For example, the materials of the dielectric layer 42, the reflective layer 41 and the semi-reflective layer 43 refer to the relevant descriptions mentioned above, which are omitted herein.

For example, the Micro LED 3 illustrated in FIG. 5 comprises a third electrode 34, a second semiconductor layer 37, the light-emitting layer 31, a first semiconductor layer 36 and a fourth electrode 35 which are stacked in sequence.

For example, the third electrode 34 is an electrode formed by a metal material that transmits light, and the fourth electrode 35 is an electrode formed by a material that reflects light.

For example, the third electrode 34 is disposed on a side of the light-emitting layer 31 close to the base substrate 1, and the fourth electrode 35 is disposed on a side of the light-emitting layer 31 away from the base substrate 1.

It should be noted that, one of the first semiconductor layer 36 and the second semiconductor layer 37 generates electrons and injects the electrons into the light-emitting layer 31, the other of the first semiconductor layer 36 and the second semiconductor layer 37 generates holes and injects the holes into the light-emitting layer 31. The holes and electrons recombine in the light-emitting layer 31 to make the light-emitting layer 31 emit light.

For example, the first semiconductor layer 36 is an N-type gallium nitride layer, and the second semiconductor layer 37 is a P-type gallium nitride layer; or the first semiconductor layer 36 is the P-type gallium nitride layer, and the second semiconductor layer 37 is the N-type gallium nitride layer.

For example, as illustrated in FIG. 5, the third electrode 34 is located on a side of the semi-reflective layer 43 away from the base substrate 1 of and in direct contact with the semi-reflective layer 43.

For example, although not shown, the semi-reflective layer 43 further serves as the third electrode 34 without additional fabrication of the third electrode 34, which saves the process of forming the third electrode separately and thus saves the production cost. For example, although not shown, the third electrode 34 is disposed on the side of the semi-reflective layer 43 away from the base substrate 1 and spaced apart from the semi-reflective layer 43, and a portion of the dielectric layer 42 for example is arranged between the first electrode 32 and the reflective layer 41.

For example, as illustrated in FIG. 5, the whole Micro LED 3 is located in the microcavity structure 4. In FIG. 5, the fourth electrode 35 is disposed on a side of the reflective layer 41 close to the base substrate 1, and the fourth electrode 35 is spaced apart from the reflective layer 41.

For example, although not shown, the reflective layer 41 further serves as the fourth electrode 35, or the fourth electrode 35 is disposed on the side of the reflective layer 41 close to the base substrate 1 and in direct contact with the reflective layer 41.

As illustrated in FIG. 5, a distance between the reflective layer 41 and the semi-reflective layer 43, that is a thickness of the dielectric layer 42, is in a same order of magnitude as a wavelength of light emitted by the Micro LED 3. For example, the light emitted by the Micro LED 3 is visible and the wavelength of the emitted light is in the order of $10^2$ nm. The thickness of the dielectric layer 42 is designed according to the wavelength of the emitted light and a refractive index of the dielectric layer 42.

For example, the inorganic light-emitting diode display panel further comprises a driving circuit 2 arranged on the base substrate 1.

As illustrated in FIG. 5, the driving circuit 2 comprises a semiconductor active layer 25, a gate insulating layer 26, a gate electrode 23, a first insulating layer 24, a source electrode 21, a drain electrode 22 and a second insulating layer 27 which are successively disposed on the base substrate 1. The second insulating layer 27 is provided with a via hole structure 28. The semiconductor active layer 25 comprises: an ohmic contact region 251 and a channel region 252, the ohmic contact region 251 has a good conductivity, and the ohmic contact region 251 is electrically connected with source electrode 21 and the drain electrode 22 respectively.

For example, in a case that the semi-reflective layer 43 further serves as the third electrode 34 or in a case that the third electrode 34 is disposed on a side of the semi-reflective layer 43 away from the base substrate 1 and in direct contact with the semi-reflective layer 43, the semi-reflective layer 43 is electrically connected to the drain electrode 22 of the driving circuit 2 by the via hole structure 28 arranged in the second insulating layer 27.

For example, in a case that the third electrode 34 is disposed on the side of the semi-reflective layer 43 away from the base substrate 1 and spaced apart from the semi-reflective layer 43, the Micro LED 3 is electrically connected with the driving circuit 2 for example by an external circuit.

For example, for the top-emitting light-emitting diode display panel illustrated in FIG. 4 or the bottom-emitting light-emitting diode display panel illustrated in FIG. 5, the distance between the reflective layer 41 and the semi-reflective layer 43 included in the microcavity structure 4 is calculated by the following formula (6):

$$\delta = 2j\left(\frac{\lambda}{2}\right) = 2nd \quad (6)$$

and
further deriving the formula (7):

$$d = j\left(\frac{\lambda}{2n}\right) \quad (7)$$

in which d is the distance between the reflective layer and the semi-reflective layer, that is the thickness of the dielectric layer 42; j is a non-zero positive integer, n is the refractive index of the dielectric layer 42, and λ is the wavelength of the light emitted by the Micro LED to calculate the distance between the reflective layer and the semi-reflective layer.

For example, Table 1 shows the changes in distances between the reflective layers and the semi-reflective layers for light with different wavelengths and different colors (comprising red, green and blue). The j in the formula (7) is usually selected according to the thickness of an LED. In the embodiments of the present disclosure, the thickness of the LED formed by conventional transfer technology is less than 1 micron (μm), which makes it easy to realize that the distance d between the reflective layer and the semi-reflective layer is less than 1 micron (μm), and further to realize that a cavity length of the microcavity structure is in the same order of magnitude as the wavelength of the visible light, and thus a good microcavity effect is realized.

Table 1 shows that a specific wavelength of red light emitted by a red Micro LED is 628 nanometers (nm), a specific wavelength of green light emitted by a green Micro LED is 518 nm, and a specific wavelength of blue light emitted by a blue Micro LED is 450 nm. Therefore, according to the formula (7), it is concluded that the distance between the reflective layer and the semi-reflective layer which are located in the red Micro LED is 209 j nm, the distance between the reflective layer and the semi-reflective layer which are located in the green Micro LED is 173 j nm, and the distance between the reflective layer and the semi-reflective layer which are located in the blue Micro LED is 150 j nm.

The embodiments of the present disclosure is illustrated by taking a parylene as the material of the dielectric layer 42 as an example. A refractive index of the parylene is 1.5. Because j is a positive integer, j may be different integers by the formula (7). The calculated distance d between the reflective layer and the semi-reflective layer requires to be greater than the thickness of the LED and less than 1 μm. For example, in the embodiments of the present disclosure, the thickness of the LED is 500 nm and j is calculated to be 4. At this time, the distance d between the reflective layer and the semi-reflective layer which are located in the red Micro LED is 836 nm, the distance d between the reflective layer and the semi-reflective layer which are located in the green Micro LED is 692 nm, and the distance d between the reflective layer and the semi-reflective layer which are located in the blue Micro LED is 600 nm.

TABLE 1

|  | Red Micro LED | Green Micro LED | Blue Micro LED |
| --- | --- | --- | --- |
| wavelength | 628 nm | 518 nm | 450 nm |
| Distance d | 209 jnm | 173 jnm | 150 jnm |

In general, a single-chip full-color LED uses a multi-layer quantum well structure which is made of gallium nitride (GaN) or indium gallium nitride (InGaN). In at least one embodiment of the present disclosure, the Micro LED 3 comprises a red Micro LED which emits red light, a green Micro LED which emits green light and a blue Micro LED which emits blue light. For those skilled in the art, the Micro LEDs which emit light of other colors may also be used, such as a Micro LED which emits yellow light.

Figure 6:
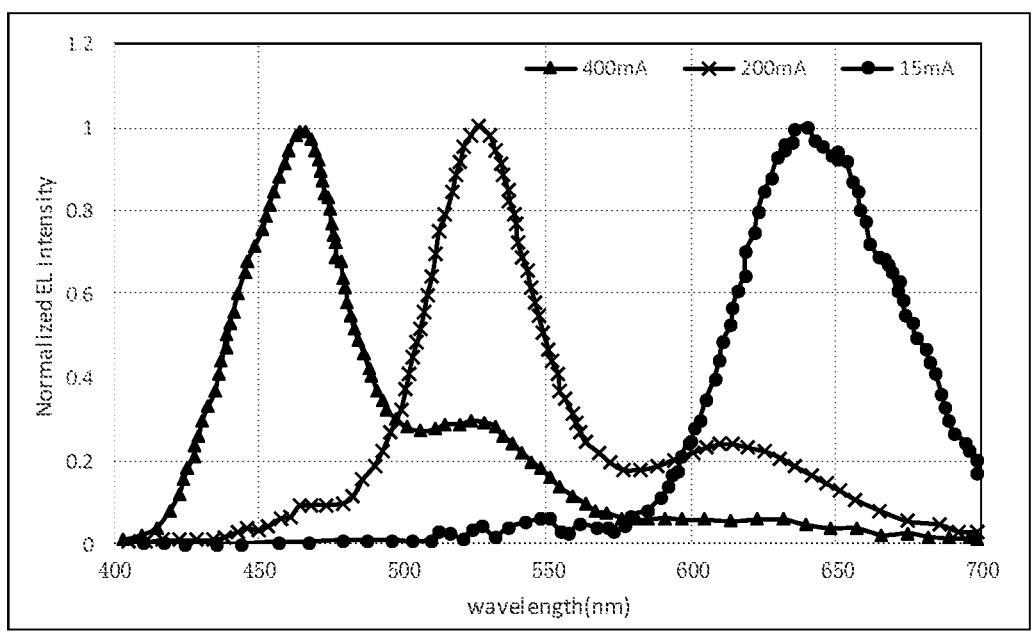
FIG. 6 is a luminescence spectrum of an LED respectively emitting three colors provided by at least one embodiment of the present disclosure.

For example, the color of light emitted by the LED, such as the Micro LED, is determined by a current passing through the Micro LED. For example, FIG. 6 is a luminescence spectrum of an LED respectively emitting three colors provided by at least one embodiment of the present disclosure. As illustrated in FIG. 6, in a case that the current is 15 milliamperes (mA), the color of light emitted by the Micro LED is red; in a case that the current is 200 milliamperes, the color of light emitted by the Micro LED is green, and in a case that the current is 400 milliamperes, the color of light emitted by the Micro LED is blue.

Figure 7:
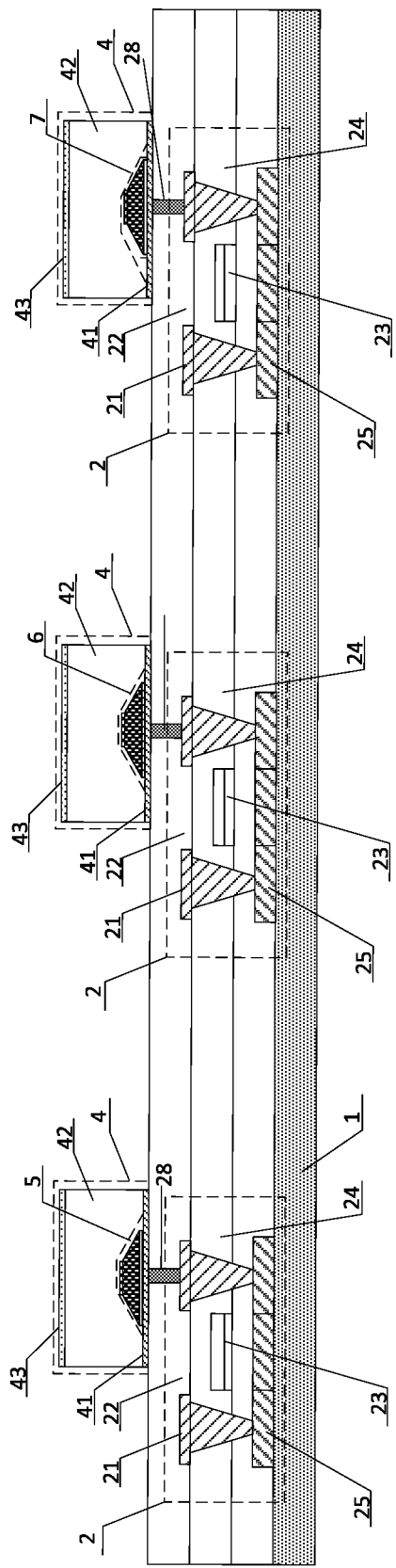
FIG. 7 is a schematic sectional view of a red light-emitting diode, a green light-emitting diode and a blue light-emitting diode in the display panel provided by at least one embodiment of the present disclosure.

For example, FIG. 7 is a schematic sectional view of a red light-emitting diode, a green light-emitting diode and a blue light-emitting diode in the display panel provided by at least one embodiment of the present disclosure. As illustrated in FIG. 7, the inorganic light-emitting diode display panel comprises a plurality of microcavity structures 4. FIG. 7 shows four microcavity structures 4. The areas of the orthographic projections of the dielectric layers on the base substrate 1 are equal. The shapes of the orthographic projections of the dielectric layers 42 on the base substrate 1 are the same. The distances between the reflective layer 41 and the semi-reflective layer 42 which are included in the plurality of microcavity structures 4 are different from each other.

The following is illustrated by taking the display panel illustrated in FIG. 7 as the example of the top-emitting inorganic light-emitting diode display panel and by taking the Micro LED as the example of the inorganic light-emitting diode.

For example, in each of the microcavity structures 4 as illustrated in FIG. 7, the area of the orthographic projection of the dielectric layer 42 on the base substrate 1 is larger than the area of the orthographic projection of the Micro LED on the base substrate 1.

For example, as illustrated in FIG. 7, the materials of the dielectric layers 42 included in the microcavity structures 4 are the same.

For example, in order to achieve a better display effect of the inorganic light-emitting diode display panel, for each of the microcavity structures 4, the orthographic projection of the reflective layer 41 on the base substrate 1, the orthographic projection of the dielectric layer 42 on the base substrate 1, and the orthographic projection of the semi-reflective layer 43 on the base substrate 1 overlap each other. The Micro LED 3 emits monochrome light. Different Micro LEDs 3 emit red light, green light or blue light respectively. Because the structure of the red Micro LED 5, the structure of the green Micro LED 6 and the structure of the blue Micro LED 7 are similar, the same components in the red Micro LED 5, the green Micro LED 6 and the blue Micro LED 7 use the same reference numerals for convenience of description.

Similar to the top-emitting inorganic light-emitting diode display panel illustrated in FIG. 4, in the microcavity structure 4 of the red Micro LED 5, the reflective layer 41 is located on the side of the first electrode of the red Micro LED 5 close to the base substrate 1, and the reflective layer 41 is electrically connected with the driving circuit 2 by the via hole structure 28. The dielectric layer 42 is located on the reflective layer 41 and covers the red Micro LED 5, and the thickness of the dielectric layer 42 is in the same order of magnitude as the wavelength of the red light emitted by the red Micro LED 5; the semi-reflective layer 43 is located on the dielectric layer 42.

For example, in the microcavity structure 4 of the green Micro LED 6, the reflective layer 41 is located on the side of the first electrode of the green Micro LED 6 close to the base substrate 1, and the reflective layer 41 is electrically connected with the driving circuit 2 by the via hole structure 28. The dielectric layer 42 is located on the reflective layer 41 and covers the green Micro LED 6, and the thickness of the dielectric layer 42 is in the same order of magnitude as the wavelength of the green light emitted by the green Micro LED 6; the semi-reflective layer 43 is located on the dielectric layer 42.

For example, in the microcavity structure 4 of the blue Micro LED 7, the reflective layer 41 is located below the blue Micro LED 7, and the reflective layer 41 is electrically connected to the driving circuit 2 by the via hole structure 28. The dielectric layer 42 is located on the reflective layer 41 and covers the blue Micro LED 7, and the thickness of the dielectric layer 42 is in the same order of magnitude as the wavelength of the blue light emitted by the blue Micro LED 7; the semi-reflective layer 43 is located on the dielectric layer 42.

In each of the microcavity structures 4 illustrated in FIG. 7, a material of the reflective layer 41 includes at least one of silver, aluminum, and an aluminum-neodymium alloy, and a metal reflectance of the reflective layer 41 is above 80%. A material of the semi-reflective layer 43 includes at least one of a magnesium-silver alloy, titanium, and molybdenum. For example, the semi-reflective layer 43 is made of the magnesium-silver alloy with a thickness of about 10 nm to 14 nm, or other metals such as titanium or molybdenum with a transmittance of more than 50%.

For example, in each of the microcavity structures 4 illustrated in FIG. 7, a material of the dielectric layer 42 includes an organic material or an inorganic material, and the dielectric layers 42 play the role of protecting the Micro LEDs. In the embodiments of the present disclosure, the dielectric layers 42 in the Micro LEDs which emit light of different colors are made of a same material, for example, the material of the dielectric layers 42 is a parylene, etc. However, for those skilled in the field, the dielectric layers 42 may be made of other suitable materials, which are not limited herein.

Figure 8:
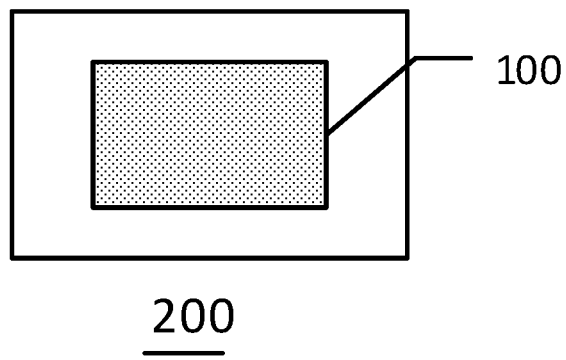
FIG. 8 is a block diagram of a display device provided by at least one embodiment of the present disclosure.

At least one embodiment of the present disclosure further provides a display device, and the display device comprises any one of the inorganic light-emitting diode display panels in the above embodiments. For example, FIG. 8 is a block diagram of a display device provided by at least one embodiment of the present disclosure. As illustrated in FIG. 8, the display device 200 comprises the inorganic light-emitting diode display panel 100 in any one of the embodiments described above. The principle of solving the problem of the display device is similar to that of the inorganic light-emitting diode display panel mentioned above. Therefore, the implementation of the display device refers to the implementation of the inorganic light-emitting diode display panel mentioned above, which is omitted herein.

For example, the display device 200 is a mobile phone, a tablet computer, a television, a display, a notebook computer, a digital photo frame, a navigator and any other product or component having a display function. Other essential components of the display device should be understood by those skilled in the art, which are omitted herein and should not be regarded as a limitation of the present disclosure. The implementation of the display device can refer to the embodiments of the inorganic light-emitting diode display panel mentioned above, which are omitted herein.

Figure 9:
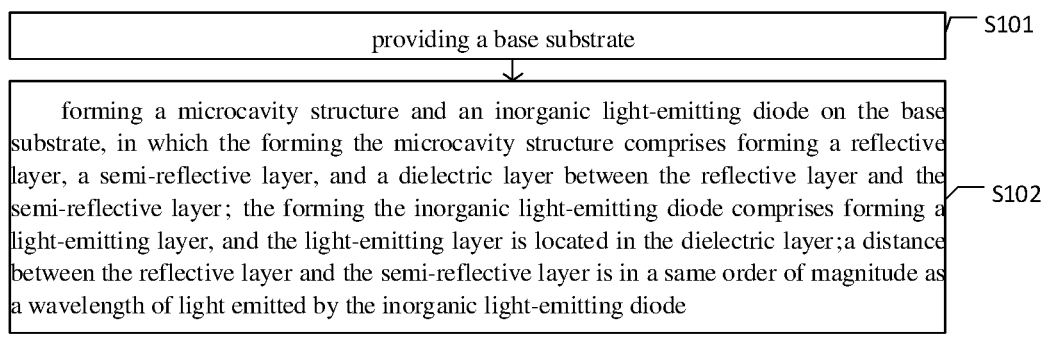
FIG. 9 is a flow diagram of a manufacturing method of an inorganic light-emitting diode display panel provided by at least one embodiment of the present disclosure.

At least one embodiment of the present disclosure further provides a method of manufacturing an inorganic light-emitting diode display panel. FIG. 9 is a flow diagram of a manufacturing method of an inorganic light-emitting diode display panel provided by at least one embodiment of the present disclosure. As illustrated in FIG. 9, the manufacturing method comprises:

S101: providing a base substrate.

S102: forming a microcavity structure and an inorganic light-emitting diode on the base substrate.

For example, the forming the microcavity structure comprises forming a reflective layer, a semi-reflective layer, and a dielectric layer between the reflective layer and the semi-reflective layer. For example, the reflective layer, the dielectric layer and the semi-reflective layer are successively formed on the base substrate, or the semi-reflective layer, the dielectric layer and the reflective layer are successively formed on the base substrate.

For example, the forming the inorganic light-emitting diode comprises forming a light-emitting layer, and the light-emitting layer is located in the dielectric layer.

For example, the forming the inorganic light-emitting diode further comprises forming a first electrode, a first semiconductor layer, a second semiconductor layer and a second electrode.

For example, a distance between the reflective layer and the semi-reflective layer is in a same order of magnitude as a wavelength of light emitted by the inorganic light-emitting diode.

Figure 10:
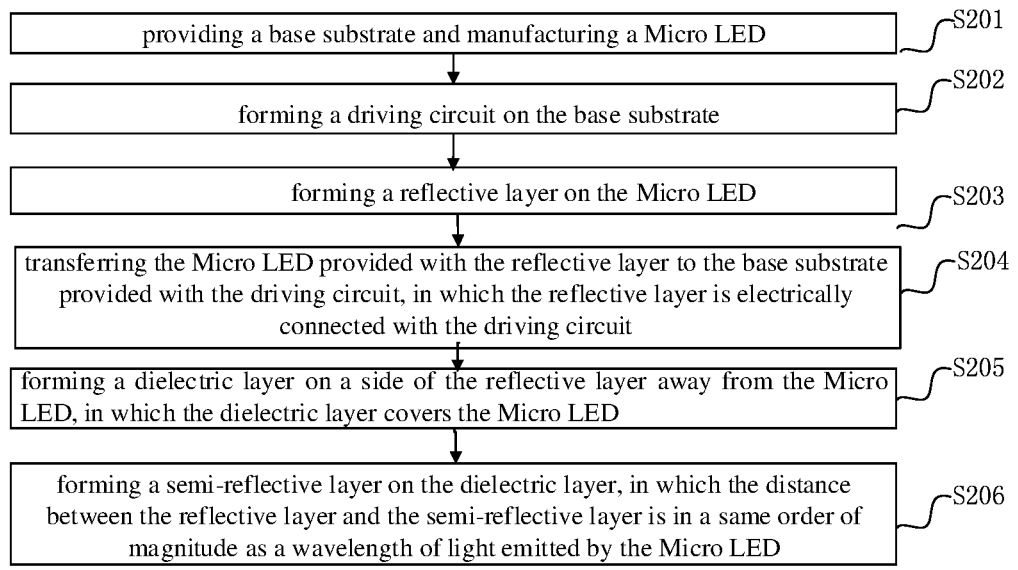
FIG. 10 is a flow diagram of a manufacturing method of a top-emitting inorganic light-emitting diode display panel provided by at least one embodiment of the present disclosure.

FIG. 10 is a flow diagram of a manufacturing method of a top-emitting inorganic light-emitting diode display panel provided by at least one embodiment of the present disclosure. The top-emitting Micro LED is illustrated as an example. As illustrated in FIG. 10, the manufacturing method comprises:

S201: providing a base substrate and manufacturing a Micro LED;

S202: forming a driving circuit on the base substrate;

S203: forming a reflective layer on the Micro LED;

S204: transferring the Micro LED provided with the reflective layer to the base substrate provided with the driving circuit, in which the reflective layer is electrically connected with the driving circuit;

S205: forming a dielectric layer on a side of the reflective layer away from the Micro LED, in which the dielectric layer covers the Micro LED;

S206: forming a semi-reflective layer on the dielectric layer, in which the distance between the reflective layer and the semi-reflective layer is in a same order of magnitude as a wavelength of light emitted by the Micro LED.

For example, the method of forming the driving circuit and the method of forming the Micro LED in the embodiments of the present disclosure refer to the conventional fabrication process, which are omitted herein.

For example, in the S203, that is, in the step of forming the reflective layer on the Micro LED, the reflective layer is formed by a patterning process.

It should be noted that, in the process of manufacturing the top-emitting inorganic light-emitting diode display panel illustrated in FIG. 4, the first electrode 32 is located on the side of the reflective layer 41 away form from the base substrate 1 and in direct contact with the reflective layer 41. The second electrode 33 is located on the side of the semi-reflective layer 43 close to the base substrate 1 and spaced apart from the semi-reflective layer 43.

For example, in some embodiments, the first electrode of the Micro LED (the electrode having a function of reflecting light) further serves as the reflective layer, that is the step S203 is omitted, and there is no need to form the reflective layer on the Micro LED; or the step S203 is not omitted, and the step of forming the first electrode (the electrode having the function of reflecting light) is omitted in the process of forming the Micro LED. Alternatively, the first electrode 32 is formed on the side of the reflective layer 41 away from the base substrate 1 and spaced apart from the reflective layer 41, and a portion of the dielectric layer 42 is arranged between the first electrode 32 and the reflective layer 41.

For example, in some embodiments, the second electrode 33 is formed on the side of the semi-reflective layer 43 close to the base substrate 1 and in direct contact with the semi-reflective layer, or the second electrode 33 further serves as the semi-reflective layer 43, and the process of forming the semi-reflective layer 43 is omitted.

It should also be noted that, in the case that the reflective layer 41 further serves as the first electrode 32 or in the case that the first electrode 32 is located on the side of the reflective layer 41 away from the base substrate 1 and in direct contact with the reflective layer 41, the reflective layer 41 is electrically connected with the driving circuit 2 by the via hole structure 28 disposed in the second insulating layer 27. In the case that the first electrode 32 is located on the side of the reflective layer 41 away from the base substrate 1 and spaced apart from the reflective layer 41, the Micro LED 3 is electrically connected with the driving circuit 2 for example by an external circuit.

For example, in the step S204 of transferring the Micro LED provided with the reflective layer to the base substrate provided with the driving circuit and electrically connecting the reflective layer with the driving circuit, the transferring technology refers to the transferring technology in the common method of manufacturing the Micro LED, which are omitted herein.

For example, in the above step S205 of forming the dielectric layer on the side of the Micro LED away from the reflective layer, and in the step S206 of forming the semi-reflective layer on the dielectric layer described above, both the dielectric layer and the semi-reflective layer are formed by the patterning process.

For example, the reflective layer, the semi-reflective layer and the dielectric layer between the reflective layer and the semi-reflective layer constitute the microcavity structure. The distance between the reflective layer and the semi-reflective layer which are included in the microcavity structure is calculated by the following formula:

$$\delta = 2j\left(\frac{\lambda}{2}\right) = 2nd.$$

Further deduce the formula:

$$d = j\left(\frac{\lambda}{2n}\right)$$

in which d is the distance between the reflective layer and the semi-reflective layer, that is the thickness of the dielectric layer 42; j is a non-zero positive integer, n is the refractive index of the dielectric layer 42, and λ is the wavelength of the light emitted by the Micro LED.

For example, the orthographic projection of the reflective layer on the base substrate, the orthographic projection of the dielectric layer on the base substrate, and the orthographic projection of the semi-reflective layer on the base substrate overlap each other.

For example, the orthographic projection of the reflective layer on the base substrate, the orthographic projection of the dielectric layer on the base substrate, and the orthographic projection of the semi-reflective layer on the base substrate overlap each other completely. An area of the orthographic projection of the reflective layer on the base substrate, an area of the orthographic projection of the dielectric layer on the base substrate and an area of the orthographic projection of the semi-reflective layer on the base substrate are equal.

For example, the area of the orthographic projection of the dielectric layer on the base substrate is larger than the area of the orthographic projection of the Micro LED on the base substrate.

For example, a material of the dielectric layer includes an organic material or an inorganic material.

For example, the organic material includes at least one of an acrylic resin and a parylene, and the inorganic material includes at least one of silicon oxide, silicon nitride, and silicon oxynitride.

For example, a material of the reflective layer includes at least one of silver, aluminum, and an aluminum-neodymium alloy.

For example, a material of the semi-reflective layer includes at least one of a magnesium-silver alloy, titanium, and molybdenum.

For example, along a direction from the base substrate to the driving circuit, the Micro LED comprises a first electrode, a first semiconductor layer, the light-emitting layer, a second semiconductor layer and a second electrode which are stacked in sequence. One of the first semiconductor layer and the second semiconductor layer generates electrons and injects the electrons into the light-emitting layer, the other of the first semiconductor layer and the second semiconductor layer generates holes and injects the holes into the light-emitting layer. The holes and the electrons recombine in the light-emitting layer and make the light-emitting layer emit light.

For example, the first semiconductor layer is an N-type gallium nitride layer, and the second semiconductor layer is a P-type gallium nitride layer; or the first semiconductor layer is the P-type gallium nitride layer, and the second semiconductor layer is the N-type gallium nitride layer.

For example, the distance between the reflective layer and the semi-reflective layer, that is, the thickness of the dielectric layer, is in a same order of magnitude as a wavelength of light emitted by the Micro LED. For example, the light emitted by the Micro LED is visible and the wavelength of the emitted light is in the order of $10^2$ nm. The thickness of the dielectric layer is designed according to the wavelength of the emitted light and the refractive index of the dielectric layer.

For example, the top-emitting inorganic light-emitting diode display panel comprises a plurality of microcavity structures. The areas of the orthographic projections of the dielectric layers on the base substrate are equal. The shapes of the orthographic projections of the dielectric layers on the base substrate are the same. The distances between the reflective layer and the semi-reflective layer which are included in the plurality of microcavity structures are different from each other.

Figure 11:
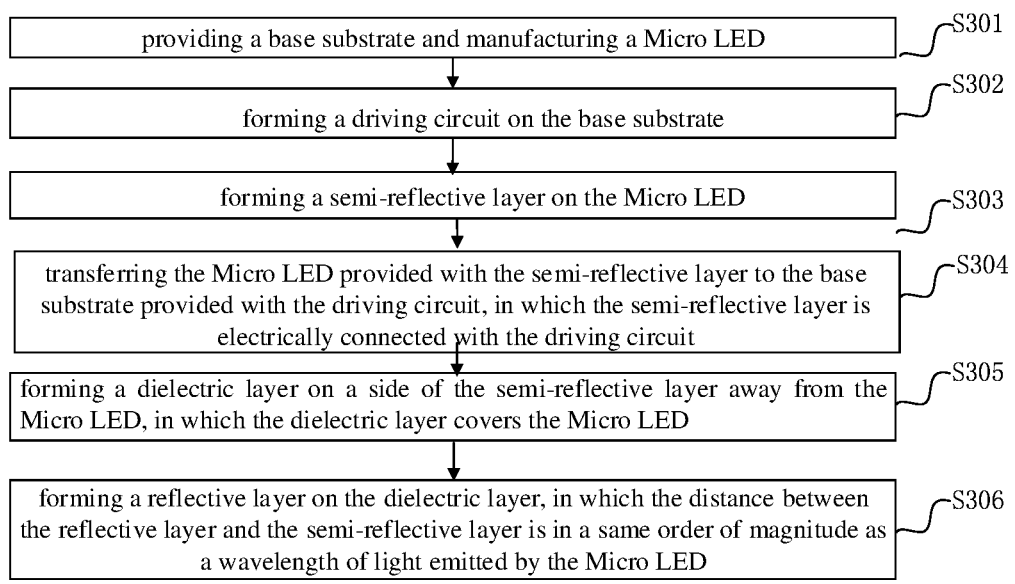
FIG. 11 is a flow diagram of a manufacturing method of a bottom-emitting inorganic light-emitting diode display panel provided by at least one embodiment of the present disclosure.

FIG. 11 is a flow diagram of a manufacturing method of a bottom-emitting inorganic light-emitting diode display panel provided by at least one embodiment of the present disclosure, the bottom-emitting Micro LED is taken for an example, as illustrated in FIG. 11, the manufacturing method comprises:

S301: providing a base substrate and manufacturing a Micro LED;

S302: forming a driving circuit on the base substrate;

S303: forming a semi-reflective layer on the Micro LED;

S304: transferring the Micro LED provided with the semi-reflective layer to the base substrate provided with the driving circuit, in which the semi-reflective layer is electrically connected with the driving circuit;

S305: forming a dielectric layer on a side of the semi-reflective layer away from the Micro LED, in which the dielectric layer covers the Micro LED;

S306: forming a reflective layer on the dielectric layer, in which the distance between the reflective layer and the semi-reflective layer is in a same order of magnitude as a wavelength of light emitted by the Micro LED.

For example, the method of forming the driving circuit and the method of forming the Micro LED in the embodiment of the present disclosure refer to the conventional fabrication process, which are omitted herein.

For example, in the S303, that is, in the step of forming the semi-reflective layer on the Micro LED, the semi-reflective layer is formed by a patterning process.

It should be noted that, in the process of manufacturing the bottom-emitting inorganic light-emitting diode display panel illustrated in FIG. 5, the third electrode 34 is located on the side of the semi-reflective layer 43 away from the base substrate 1 and in direct contact with the semi-reflective layer 43. The fourth electrode 35 is located on the side of the reflective layer 41 close to the base substrate 1 and spaced apart from the reflective layer 41.

For example, in some embodiments, the third electrode of the Micro LED (the electrode having a function of transmitting light) further serves as the semi-reflective layer, that is the step S303 is omitted, and there is no need to form the semi-reflective layer on the Micro LED, or the step S303 is not omitted, and the step of forming the third electrode (the electrode having the function of transmitting light) is omitted in the process of forming the Micro LED. Alternatively, the third electrode 34 is formed on the side of the semi-reflective layer 43 away from the base substrate 1 and spaced apart from the semi-reflective layer 43, and a portion of the dielectric layer 42 is arranged between the third electrode 34 and the semi-reflective layer 43.

For example, in some embodiments, the fourth electrode 35 is formed on the side of the reflective layer 41 close to the base substrate 1 and in direct contact with the reflective layer 41, or the fourth electrode 35 further serves as the reflective layer 41, and the process of forming the semi-reflective layer 43 is omitted.

It should also be noted that, in the case that the semi-reflective layer 43 further serves as the third electrode 34 or in the case that the third electrode 34 is located on the side of the semi-reflective layer 43 away from the base substrate 1 and in direct contact with the semi-reflective layer 43, the semi-reflective layer 43 is electrically connected with the driving circuit 2 by the via hole structure 28 disposed in the second insulating layer 27. In the case that the third electrode 34 is located on the side of the semi-reflective layer 43 away from the base substrate 1 and space apart from the semi-reflective layer 43, the Micro LED 3 is electrically connected with the driving circuit 2 by an external circuit.

For example, in the step S304 of transferring the Micro LED provided with the semi-reflective layer to the base substrate provided with the driving circuit and electrically connecting the semi-reflective layer with the driving circuit, the transferring technology refers to the transferring technology in the common method of manufacturing the Micro LED, which are omitted herein For example, in the above step S305 of forming the dielectric layer on the side of the Micro LED away from the semi-reflective layer, and in the step S306 of forming the reflective layer on the dielectric layer described above, both the dielectric layer and the reflective layer are formed by the patterning process.

The inorganic light-emitting diode display panel, the method of manufacturing the inorganic light-emitting diode display panel and the display device provided in at least one embodiment of the present disclosure have at least one of the beneficial effects as follows:

(1) The inorganic light-emitting diode display panel provided in the embodiments of the present disclosure improves the purity of the emitted light, thereby the problem of white distortion is solved, and the whole display effect of the inorganic light-emitting diode display panel is improved.

(2) In the inorganic light-emitting diode display panel provided by the embodiments of the present disclosure, the thickness of the dielectric layer is designed according to the wavelength of the emitted light and the refractive index of the dielectric layer, so that the dielectric layers are suitable for the inorganic light-emitting diode display panels which emit light of different colors, and the purity of the emitted light is improved.

The following points need to be explained:

(1) The drawings of the embodiments of the present disclosure are only related to the structures related to the embodiments of the present disclosure, and other structures can refer to general designs.

(2) For clarity, in the drawings for describing the embodiments of the present disclosure, a thickness of a layer or a thickness of a region is exaggerated or reduced, that is, these drawings are not drawn according to an actual scale. It should be understood that: in a case that an element such as a layer, a film, a region or a substrate is referred to as being disposed "on" or "beneath" another element, the element may be "directly" disposed "on" or "beneath" another element, or an intermediate element may be provided.

(3) In the absence of conflict, the embodiments of the present disclosure and the features in the embodiments can be combined with each other to obtain new embodiments.

What is described above is related to the illustrative embodiments of the disclosure only and not limitative to the scope of the disclosure. Therefore, the scopes of the disclosure are defined by the accompanying claims.

What is claimed is:

1. An inorganic light-emitting diode display panel, comprising:
    a base substrate;
    a microcavity structure and an inorganic light-emitting diode which are disposed on the base substrate;
    wherein the microcavity structure comprises a reflective layer, a semi-reflective layer and a dielectric layer located between the reflective layer and the semi-reflective layer;
    the inorganic light-emitting diode comprises a light-emitting layer, and the light-emitting layer is located in the dielectric layer;
    a distance between the reflective layer and the semi-reflective layer is in a same order of magnitude as a wavelength of light emitted by the inorganic light-emitting diode.

2. The inorganic light-emitting diode display panel according to claim 1, wherein a relationship between the distance between the reflective layer and the semi-reflective layer and the wavelength of the light emitted by the inorganic light-emitting diode is:

$$d = j\left(\frac{\lambda}{2n}\right)$$

wherein d is the distance between the reflective layer and the semi-reflective layer; j is a non-zero positive integer; n is a refractive index of the dielectric layer; and λ is the wavelength of the light emitted by the inorganic light-emitting diode.

3. The inorganic light-emitting diode display panel according to claim 1, wherein
    the inorganic light-emitting diode is a top-emitting inorganic light-emitting diode, and the reflective layer, the dielectric layer and the semi-reflective layer are sequentially disposed away from the base substrate; and
    the inorganic light-emitting diode further comprises a first electrode disposed on a side of the light-emitting layer close to the base substrate and a second electrode disposed on a side of the light-emitting layer away from the base substrate.

4. The inorganic light-emitting diode display panel according to claim 3, wherein the reflective layer further serves as the first electrode, or the first electrode is disposed on a side of the reflective layer away from the base substrate and in direct contact with the reflective layer, or the first electrode is disposed on the side of the reflective layer away from the base substrate and spaced apart from the reflective layer.

5. The inorganic light-emitting diode display panel according to claim 4, wherein the semi-reflective layer further serves as the second electrode, or the second electrode is disposed on a side of the semi-reflective layer close to the base substrate and in direct contact with the semi-reflective layer, or the second electrode is disposed on the side of the semi-reflective layer close to the base substrate and spaced apart from the semi-reflective layer.

6. The inorganic light-emitting diode display panel according to claim 5, further comprising a driving circuit disposed on the base substrate, wherein the reflective layer is electrically connected with the driving circuit in a case that the reflective layer further serves as the first electrode or in a case that the first electrode is disposed on the side of the reflective layer away from the base substrate and in direct contact with the reflective layer.

7. The inorganic light-emitting diode display panel according to claim 1, wherein
    the inorganic light-emitting diode is a bottom-emitting inorganic light-emitting diode, and the semi-reflective layer, the dielectric layer and the reflective layer are sequentially disposed away from the base substrate; and
    the inorganic light-emitting diode further comprises a third electrode disposed on a side of the light-emitting layer close to the base substrate and a fourth electrode disposed on a side of the light-emitting layer away from the base substrate.

8. The inorganic light-emitting diode display panel according to claim 7, wherein the semi-reflective layer further serves as the third electrode, or the third electrode is disposed on a side of the semi-reflective layer away from the base substrate and in direct contact with the semi-reflective layer, or the third electrode is disposed on the side of the semi-reflective layer away from the base substrate and spaced apart from the semi-reflective layer.

9. The inorganic light-emitting diode display panel according to claim 8, wherein the reflective layer further serves as the fourth electrode, or the fourth electrode is disposed on a side of the reflective layer close to the base substrate and in direct contact with the reflective layer, or the fourth electrode is disposed on the side of the reflective layer close to the base substrate and spaced apart from the reflective layer.

10. The inorganic light-emitting diode display panel according to claim 9, further comprising a driving circuit disposed on the base substrate, wherein the semi-reflective layer is electrically connected with the driving circuit in a case that the semi-reflective layer further serves as the third electrode or in a case that the third electrode is disposed on the side of the semi-reflective layer away from the base substrate and in direct contact with the semi-reflective layer.

11. The inorganic light-emitting diode display panel according to claim 1, wherein an orthographic projection of the reflective layer on the base substrate, an orthographic projection of the dielectric layer on the base substrate, and an orthographic projection of the semi-reflective layer on the base substrate overlap each other.

12. The inorganic light-emitting diode display panel according to claim 1, wherein an area of an orthographic projection of the dielectric layer on the base substrate is larger than an area of an orthographic projection of the light-emitting layer on the base substrate.

13. The inorganic light-emitting diode display panel according to claim 1, further comprising a plurality of microcavity structures, wherein areas of orthographic projections of the dielectric layers included in the plurality of the microcavity structures on the base substrate are equal, shapes of the orthographic projections of the dielectric layers included in the plurality of the microcavity structures on the base substrate are the same, and distances between the reflective layers and the semi-reflective layers included in the plurality of the microcavity structures are different from each other.

14. The inorganic light-emitting diode display panel according to claim 13, wherein materials of the dielectric layers included in the plurality of the microcavity structures are the same.

15. The inorganic light-emitting diode display panel according to claim 1, wherein a material of the dielectric layer includes an organic material or an inorganic material, and the organic material includes at least one of an acrylic resin and a parylene; and the inorganic material includes at least one of silicon oxide, silicon nitride, and silicon oxynitride.

16. The inorganic light-emitting diode display panel according to claim 1, wherein a material of the reflective layer includes at least one of silver, aluminum, and an aluminum-neodymium alloy; a material of the semi-reflective layer includes at least one of a magnesium-silver alloy, titanium, and molybdenum.

17. The inorganic light-emitting diode display panel according to claim 1, wherein the inorganic light-emitting diode emits monochrome light, and the monochrome light is red light, green light or blue light.

18. A display device, comprising the inorganic light-emitting diode display panel according to claim 1.

19. A method of manufacturing an inorganic light-emitting diode display panel, comprising:
   providing a base substrate;
   forming a microcavity structure and an inorganic light-emitting diode on the base substrate;
   wherein the forming the microcavity structure comprises forming a reflective layer, a semi-reflective layer, and a dielectric layer located between the reflective layer and the semi-reflective layer;
   the forming the inorganic light-emitting diode comprises forming a light-emitting layer, and the light-emitting layer is located in the dielectric layer;
   a distance between the reflective layer and the semi-reflective layer is in a same order of magnitude as a wavelength of light emitted by the inorganic light-emitting diode.

20. The manufacturing method according to claim 19, wherein a relationship between the distance between the reflective layer and the semi-reflective layer and the wavelength of the light emitted by the inorganic light-emitting diode is:

$$d = j\left(\frac{\lambda}{2n}\right)$$

wherein d is the distance between the reflective layer and the semi-reflective layer; j is a non-zero positive integer; n is a refractive index of the dielectric layer; and $\lambda$ is the wavelength of the light emitted by the inorganic light-emitting diode.

* * * * *